United States Patent [19]

Joyce et al.

[11] Patent Number: 4,843,029
[45] Date of Patent: Jun. 27, 1989

[54] METHOD OF MANUFACTURING A HETEROEPITAXIAL COMPOUND SEMICONDUCTOR DEVICE USING PHOTO SMOOTHING BETWEEN LAYER GROWTH

[75] Inventors: Bruce A. Joyce, East Grinstead; Philip Dawson, Horsham, both of England

[73] Assignee: U.S. Philips Corporation, New York, N.Y.

[21] Appl. No.: 176,914

[22] Filed: Apr. 4, 1988

[30] Foreign Application Priority Data

Apr. 6, 1987 [GB] United Kingdom ............... 8708153

[51] Int. Cl.⁴ .......................................... H01L 21/205
[52] U.S. Cl. ........................... 437/82; 148/DIG. 48; 148/DIG. 65; 148/DIG. 72; 148/DIG. 169; 156/612; 437/107; 437/126; 437/133; 437/173; 437/936; 437/963; 437/80
[58] Field of Search ................... 148/DIG. 48, 56, 65, 148/71, 72, 110, 169; 156/610–615; 437/81, 82, 80, 107, 126, 133, 173, 936, 963, 948

[56] References Cited

U.S. PATENT DOCUMENTS

| | | | |
|---|---|---|---|
| 4,071,383 | 1/1978 | Nagata et al. | 156/610 |
| 4,581,248 | 4/1986 | Roche | 427/53.1 |
| 4,645,687 | 2/1987 | Donnelly et al. | 427/53.1 |
| 4,740,386 | 4/1988 | Cheung | 427/53.1 |

OTHER PUBLICATIONS

Bedair et al., "Laser Selective Deposition of GaAs on Si", Appl. Phys. Lett. 48(2), Jan. 13, 1986, pp. 174–176.
Soga et al., "High Temperature Growth Rate in MOCVD Growth of AlGaAs", J. Crystal Growth, 68 (1984), pp. 169–175.
Kukimoto et al., "Selective ... Laser-Assisted MOVPE of GaAs and AlGaAs", J. Crystal Growth, 77 (1986), pp. 223–228.
Aoyagi et al., "Laser-Enhanced Metalorganic Chemical Vapor Deposition Crystal Growth in GaAs", Appl. Phys. Lett., 47(2), Jul. 15, 1985, pp. 95–96.

Primary Examiner—Brian E. Hearn
Assistant Examiner—William Bunch
Attorney, Agent, or Firm—Paul R. Miller

[57] ABSTRACT

A method of manufacturing a semiconductor device is described in which gaseous material is supplied into a reaction chamber containing a substrate to cause a first epitaxial layer of a first material to grow on the substrate and switching means are then operated to alter within a predetermined period the supply of gaseous material into the reaction chamber to cause a second eitaxial layer of a second material to grow on the first layer. During the predetermined period of radiant heat source is activated to radiantly heat the surface of the first layer so as to smooth the first layer on an atomic level before growth of the second layer is commenced. The radiant heat source may be a laser capable of directing one or more laser pulses at the surface to be radiantly heated.

16 Claims, 1 Drawing Sheet

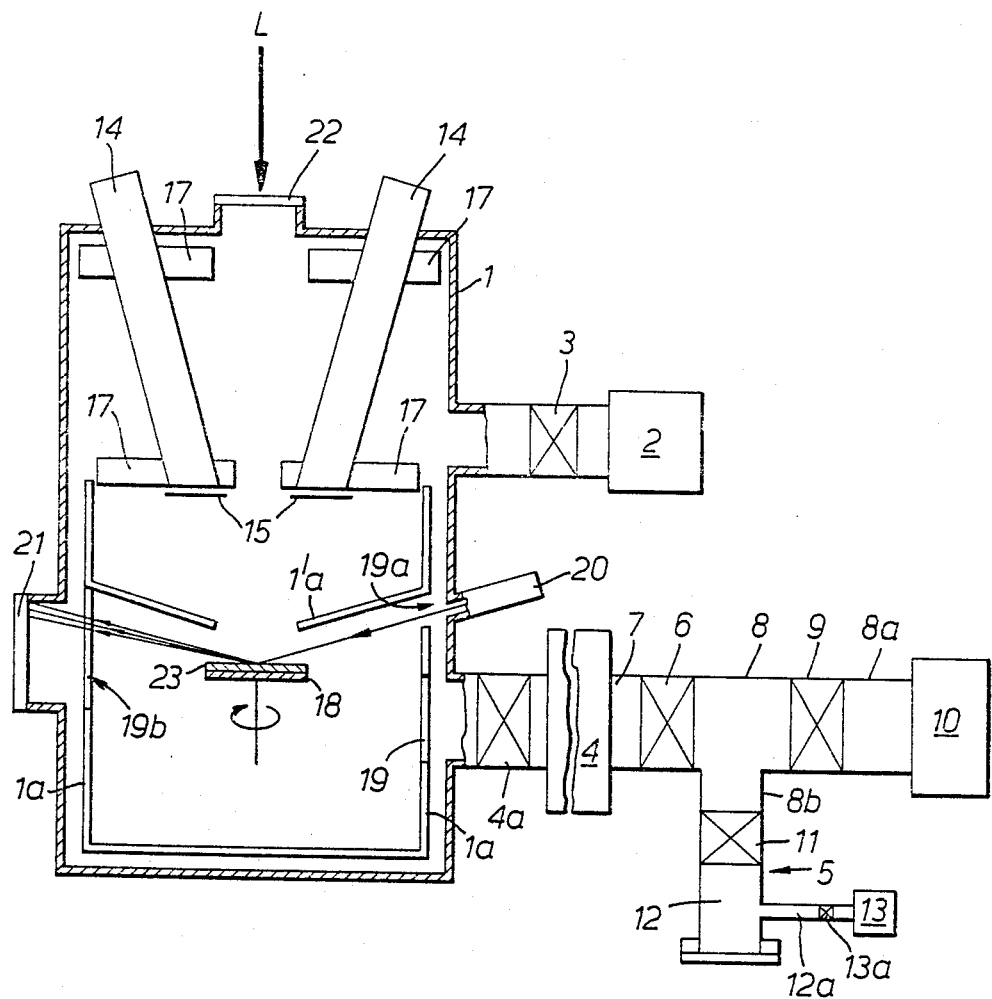

METHOD OF MANUFACTURING A HETEROEPITAXIAL COMPOUND SEMICONDUCTOR DEVICE USING PHOTO SMOOTHING BETWEEN LAYER GROWTH

DESCRIPTION

This invention relates to a method of manufacturing a semiconductor device, which method comprises supplying gaseous material via supply means into a reaction chamber containing a substrate to cause a first epitaxial layer of a first material to grow on the substrate and operating switching means to alter within a predetermined period the supply of gaseous material via the supply means into the reaction chamber to cause a second epitaxial layer of a second material to grow on the first layer.

Present techniques for growing semiconductor material layers on substrates, especially techniques such as molecular beam epitaxy and metal organic vapour phase epitaxy, enable layers of semiconductor material to be grown which are so thin, typically in the range of 5 nm (nanometres) to 50 nm (although layers which are made up of only a few atomic layers have been grown), that quantum effects influence the electron energy levels of the semiconductor material layer. Where such a thin layer is sandwiched between barrier layers of semiconductor material having a higher bandgap a quantum well is formed in which electron and hole energy levels are determined by the width of the well (i.e. the width of the sandwiched layer) and also by the depth of the well which may be related to the composition of the barrier layers. Periodic structures consisting of alternate well and barrier layers can be formed and where the wells couple electronically a structure known as a superlattice is formed. Such sructures have useful electronic and optical properties.

Where such very thin layers are involved, then the nature of the interface between layers becomes important and it is desirable for the interfaces to be made as smooth as possible on an atomic level.

It has been found, for example as described in a paper entitled "One atomic layer heterointerface fluctuations in GaAs-AlAs quantum well structures and their suppression by insertion of smoothing period in molecular beam epitaxy" by H. Sakaki et al published in the Japansese Journal of Applied Physics Vol 24 No 6, June 1985 pages L417 to L420 and in a paper entitled "Photoluminescence studies of the effects of interruption during the growth of single GaAs/Al$_{0.37}$Ga$_{0.63}$Al quantum wells" by R. C. Miller et al published in Applied Physics Letters 49(19), November 1986, pages 245-7, that interfaces between layers of semiconductor material can be smoothed or made more flat on an atomic level by interrupting the growth procedure for up to several minutes between growth of different layers. However, as indicated in the abovementioned paper by R. C. Miller et al, such interruptions in the growth procedure increase the likelihood of contamination at the interface due to background impurities which may be present in the reaction chamber in which the material is being grown.

According to the present invention, there is provided a method of manufacturing a semiconductor device, which method comprises supplying gaseous material via supply means into a reaction chamber containing a substrate to cause a first epitaxial layer of a first material to grow on the substrate and operating switching means to alter within a predetermined period the supply of gaseous material via the supply means into the reaction chamber to cause a second epitaxial layer of a second material to grow on the first layer characterised by, during the predetermined period, activating a radiant heat source directed at a surface of the first layer so as to radiantly heat the surface of the first layer during the predetermined period so as to smooth the first layer before growth of the second layer is commenced.

As used herein, the term "gaseous material" includes conventional gases and vapours and also the so-called molecular atomic and ionic beams used in molecular beam epitaxy where an ultra high vacuum exists within the reaction chamber so that the mean free path of the molecules, atoms or ions is comparable to or greater than the distance from the source of the beam to the substrate, that is so that the number of collisions occurring before the molecules, atoms or ions of the beams reach the substrate is negligible.

A method embodying the invention enables the interface between adjacent layers to be smoothed on an atomic level whilst at the same time avoiding long interruptions of the growth process which could result in contamination of the interface.

A method embodying the invention may comprise radiantly heating the surface of the first layer by directing a laser source at the first layer during the predetermined period and may also comprise causing the laser to pulse on and off during the predetermined period. Use of a laser source enables rapid switching on or off of the heat source whilst at the same time facilitating rapid heating.

A method embodying the invention may be used to grow multi-layered structures, for example such a method may comprise growing further alternate first and second layers including activating the radiant heat source to radiantly heat the surface of each layer during the predetermined period in which the supply of gaseous material is being altered to supply the gaseous material via the supply means so as to smooth a layer on an atomic level before growth of the next layer is commenced.

A method embodying the invention may comprise maintaining a pressure below atmospheric pressure within the reaction chamber. In one arrangement, an ultra-high vacuum may be maintained in the reaction chamber and at least one of the species introduced into the reaction chamber by directing a beam of molecules, atoms or ions into the reaction chamber towards the substrate. At least part of the gaseous material may be introduced as a gaseous metal organic compound.

At least one and possibly both the or each of the first and second layers may have a thickness less than approximately 50 nm. The step of introducing the gaseous material to grow the first and second layers may comprise introducing gaseous material comprising group III and group V elements so that the or each first layer grows as an epitaxial layer of a first III-V semiconductor material and the or each second layer grows as an epitaxial layer of a second III-V semiconductor material. The gaseous material introduced to grow the or each first layer may comprise gallium and arsenic and the gaseous material introduced to grow the or each second layer may comprise gallium, arsenic and aluminium.

The present invention also provides a semiconductor device whenever manufactured using a method in accordance with the invention.

A method embodying the present invention may have particular advantages where the layered semiconductor material being formed is a semiconductor layered structure being grown on a substrate by an ultra high vacuum technique such as molecular beam epitaxy. In particular, where the growth of multiple quantum well or superlattice structures is concerned, the thinness of the layers (which may be as little as a few monolayers thick) means that a large proportion of the structure may be taken up by the interfaces between layers and the properties of these interfaces could severely affect the characteristics of any device manufactured from the semiconductor material. In such a case, a method embodying the invention enables the surface of a layer to be smoothed before the succeeding layer is grown without the necessity for having to interrupt the growth process for up to several minutes. For example, where a laser is used as the radiant heat source, no interruption of the growth process may be required. Thus, in the case of molecular, atomic or ion beam sources produced in for example Knudsen cells, the time required to cause the shutters to switch on or off the supply of a beam or beams to alter the supply of gaseous material to the substrate, which time will normally be of the order of a tenth of a second, should be sufficient. Of course, in any case, it would be possible to interrupt the growth process for a short while (considerably less than up to several minutes) whilst carrying out the radiant heating although this would increase the time in which contamination of the interface by undesired impurities could occur.

It should be noted that GB-A No. -2170043 describes apparatus for the growth of semiconductor thin films on a substrate by molecular beam epitaxy in which the molecular beam epitaxy chamber is provided with an optical window through which electromagnetic radiation can be introduced to irradiate the surface of the substrate during molecular beam epitaxial growth. GB-A No. -2170043 indicates that the irradiation of the surface of the substrate with electromagnetic radiation, in the preferred arrangement laser light, causes the acceleration of both the reaction between the substrate and the molecular and the decomposition of the molecules of the molecular beam so facilitating growth of good quality material. There is however no recognition whatsoever in GB-A No. -2170043 of the problems ocurring at interfaces between layers of epitaxial material nor is there any suggestion in GB-A No. -2170043 that the interface between adjacent layers of different material could be smoothed on an atomic level by activating a radiant heat source so as to radiantly heat the surface of a first layer during the predetermined period in which the supply of gases is being altered to enable growth of a second layer.

Where a multiple quantum well, superlattice or similar thin layer structure is being grown using a method embodying the invention, it is particularly advantageous to use a laser because the use of a laser enables a very rapid temperature change of the layer surface in the time it takes to move the shutters to start supply of the beams for the next layer. As indicated above, a method embodying the invention may be used to produce by molecular beam epitaxy a semiconductor device consisting of alternate layers of different III-V semiconductor compounds (where the symbols III and V signify groups III and V of the periodic table), for example alternate layers of GaAs (gallium arsenide) and $Ga_xAl_{1-x}As$ (gallium aluminium arsenide, where the subscript x indicates the relative proportions of gallium and aluminium). In such a case, the switching of the molecular beams in the predetermined period between first and second layers merely involves when changing from a first to a second layer, the switching off or on of the group III source(s), for example, where alternate layers of GaAs and $Ga_xAl_{1-x}As$ are being grown switching off and on, respectively, the aluminium source. Circuitry required to operate the laser may be controlled by activation, i.e. opening and closing, of shutters of the Group III source(s).

Although the above discussion refers to first and second layers of different materials, the materials may differ only in their doping or lack of doping. For example, a method embodying the invention may be used to grow a multi-layer structure consisting of alternately n-type and p-type doped layers of the same semiconductor material in which case only the dopant sources need be switched when changing between layers. Also where a multi-layer structure is concerned, third and fourth etc. layers of different materials may be involved so as to build up a three or four etc. step repeat pattern of layers.

An embodiment of the invention will now be described, by way of example, with reference to the accompanying drawing in which the single figure illustrates, in block diagrammatic form and partially in section, apparatus for carrying out a method embodying the invention. It should of course be appreciated that the figure is a much simplified and very diagrammatic representation of the apparatus and is not drawn to scale, various parts having been relatively enlarged or reduced in the interests of clarity.

Referring now to the single figure of the drawing, there is shown a very schematic representation of apparatus of a known type (for example a Varian Gen II MBE Machine) for carrying out molecular beam epitaxy.

The apparatus comprises a stainless steel vacuum chamber 1 capable of use with ultra high internal vacua. An ultra high vacuum pumping system, for example an ion-pump and possibly also a cryogenic pump 2 is connected via a valve system 3 and stainless steel piping to the chamber to enable a desired ultra high vacuum to be attained within the chamber 1.

A preparation chamber 4 is connected via a first valve system 4a to the vacuum chamber 1. The preparation chamber 4 is connected to a sample entry lock system 5. The sample entry lock system comprises a first valve system 6 connected to an outlet 7 of the preparation chamber 4 and a branched or T-junction stainless steel pipe 8 providing one line 8a leading via a further valve system 9 to an ultra high vacuum pumping system 10 (for example the same pumping system 2 mentioned above) and a second line 8b leading via a third valve system 11 to a sample entry lock 12 which is evacuated by a rough pump 13 connected to the sample entry lock by a pipe 12a and a valve system 13a. A sample transfer mechanism (not shown) is provided for mechanically transferring samples between the sample lock 12, the preparation chamber 4 and a rotatable support stage 18 within the vacuum chamber via a window 19 in hollow cryogenic panels 1a provided within the chamber 1. Liquid nitrogen is passed through the cryogenic panels 1a which serve to provide thermal isolation and to condense gaseous material not impinging on a substrate mounted on the rotatable support stage 18.

Effusion cells 14 are mounted to the vacuum chamber 1 so as to extend inwardly of the chamber 1 and as to be directed almost normally of and towards the sample support stage 18. Mechanical shutters 15 close outlets of the effusion cells 14. The number of effusion cells 14 required will of course depend on the particular material it is desired to grow. In the method to be described below a minimum of three effusion cells (one each for the gallium, arsenic and aluminium sources) are required and possibly four, five or six effusion cells may be required depending upon whether any dopant sources are desired and the number of elemental sources required to produce the desired layered semiconductor structure. Individual effusion cells 14 are thermally isolated by a succession of water-cooled heat shields 17 and the flux is regulated, as indicated above, by the mechanical shutter 15 associated with the cell 14 and the cell temperature. The cryogenic panels 1a include a baffle 1'a which facilitates direction of the molecular beams at a sample placed on the sample stage.

Each of the effusion cells 14 may be a standard heated Knudsen cell which has an inner crucible made of reactor-grade graphite or pyrolytic boron nitride in which a pure solid sample of one of the materials from which molecular beams are required, for example gallium (Ga), arsenic ($As_y$ —where y=2 or 4), or aluminium (Al), (where the material to be grown is $Ga_xAl_{1-x}As$), is heated by a thermocouple arrangement to produce gaseous atoms or molecules which are directed via the outlet of the effusion cell 14 into the vacuum chamber 1 as a molecular beam when the mechanical shutter 15 associated with the cell 14 is open. Beam intensities are controlled by the temperatures within the effusion cells 14 and for molecular flow are given by:

$$J_1 = [ap_i \pi d^2 (2\pi_i kT)] \cos \theta \quad (1)$$

where $J_i$ is the flux per unit area at a distance d from the source, which has an orifice of area a and contains atoms (molecules) of mass $m_i$ having an equilibrium vapour pressure $p_i$ at temperature T K (degrees Kelvin). $\theta$ is the angle between the beam and the substrate surface normal. A single microcomputer may be used to control all of the cell temperatures (which determine the fluxes for a given system), and all of the shutters 15 to achieve any desired growth sequence. Fluxes are usually monitored by an ion gauge (not shown) which can be rotated in and out of the molecular beams.

A quadrupole mass spectrometer (not shown) may be provided for residual gas analysis and a reflection high energy electron diffraction (RHEED) arrangement for assessment of surface structure. The RHEED arrangement consists simply of a 5–20 keV (kilo electron volt) electron gun 20 and a fluorescent screen 21, each aligned with a respective window 19a and 19b in the cryogenic panels 1a with the electron beam emitted by the gun 20 arranged to be at a very shallow angle (1 to 3 degrees) to the substrate surface. Additionally there may be an Auger electron spectrometer to determine surface composition and purity. Some or all of these analytical facilities may be housed in the separate analysis/preparation chamber 4 mounted between the sample insertion interlock system 5 and the chamber 1.

The vacuum chamber 1 is provided with a viewing port 22 to enable a sample to be observed. In case of the apparatus used in a method embodying the invention, a radiant heat source in the form of a laser (indicated schematically by the broad arrow labelled L) is arranged above the viewing port 22 so as to enable the surface of the sample being grown to be heated as will be described hereinafter. The viewing port 22 should of course be transparent to the wavelength or range of wavelengths intended to be used as the heat source.

An example of a method embodying the invention will now be described in which the semiconductor material being grown is a III-V semiconductor material.

A sample is first introduced into the sample entry lock 12 and after the pressure within the sample entry lock has been reduced by operation of the rough pump 13, the sample is then transferred to the preparation chamber 4 by the sample transfer mechanism (not shown). A pressure of about $10^{-10}$ Torr is maintained in the preparation chamber and the sample is heated to about 400 degrees Celsius in the preparation chamber to cause outgassing of undesired impurities. The sample is then transferred by the sample transfer mechanism (not shown) to the sample support stage 18 which is then rotated. The figure illustrates diagrammatically a sample 23 mounted on the sample stage 18. A pressure of about $5 \times 10^{-11}$ Torr is maintained within the vacuum chamber 1. To provide a basis for high quality epitaxial layers, a substrate surface free of crystallographic and other defects and clean on an atomic scale (~0.01 ML of impurities) should be prepared. This involves free etching of the surface of a sample by an oxidative process which removes any carbon and leaves the surface covered with a protective volatile oxide. The protective volatile oxide is removed by heating the substrate 23 (using a heater mounted to the substrate stage or possibly using an external radiant heat source not shown) in a molecular beam produced from the effusion cell 14 containing the group V element source, for example arsenic.

Growth of epitaxial material on the substrate is initiated by bringing the substrate 23 to a temperature of, for example, 50 degrees Celsius in the molecular beam of the group V element and then opening the shutter(s) of the group III element source(s) plus that of any cell containing a desired dopant, for example beryllium where p-type material is required or silicon (or tin) where n-type material is required. Growth rates are in the range 0.1–10.0 $\mu m\ hr^{-1}$, corresponding to molecular beam fluxes from $\sim 5 \times 10^{13}$ to $\sim 5 \times 10^{15}$ atoms $cm^{-2}s^{-1}$. The Group V element flux is typically 3–5 times greater than that of the Group III element. A higher flux of the group V element is used to ensure that the group V element population at the surface is not undesirably reduced by desorption of the group V element molecules, but it is the group III element flux which determines the growth rate.

Taking as a particular example growth of alternate epitaxial layers of gallium arsenide (GaAs) and gallium aluminium arsenide ($Ga_xAl_{1-x}As$) on a gallium arsenide substrate and assuming that the gallium arsenide substrate sample is already positioned on the support stage 18 in the vacuum chamber 1 in which a pressure of about $5 \times 10^{-11}$ Torr is being maintained, the effusion cells 14 are first heated by their respective thermocouples to produce the desired fluxes, all shutters 15 being closed at this stage. The GaAs substrate 23 is then heated either by a substrate heater attached to the support stage 18 or an external radiant heating source and the shutter 15 of the arsenic source effusion cell 14 opened to subject the substrate to an $As_2$ (or $As_4$) molecular beam or flux of for example $4 \times 10^{15}$ atoms/cm$^2$/sec, the heating of the substrate being sufficient to remove the volatile oxide from the substrate. Growth is then initiated by bringing the substrate to a desired growth temperature, for example 650 degrees Celsius, in the As$_2$ (or As$_4$) molecular beam and opening the shutters 15 of the gallium and alluminium source effusion cells 14 so as to direct molecular beams of gallium and aluminium atoms of, for example, 1 to $2 \times 10^{15}$ atoms/cm$^2$/sec at the substrate surface to enable an epitaxial layer of $Ga_xAl_{1-x}As$ with a desired composition to grow, the desired composition being determined by the relative fluxes of aluminium and gallium which themselves will, as indicated by equation (1), be controlled by the effusion cell temperatures.

Growth of epitaxial layers may be monitored by an appropriate technique, for example the RHEED technique mentioned above (and discussed in detail in, for example, EP-B No. -110468) which uses the fact that the intensity of the high energy electron beam reflected from the surface of the growing layer, especially the specularly reflected beam which shows larger variations than the individual diffracted beams, oscillates with the growth of the layer and enables the number of monolayers grown on the substrate to be determined. The epitaxial layer of $Ga_xAl_{1-x}As$ grown on the GaAs substrate may form a buffer layer and may be for example 50 nm to 100 nm thick. After formation of the desired thickness of the buffer layer, the Al source is switched off by the computer causing the shutter 15 of the aluminium source effusion cell 14 to move to close the outlet of the cell to allow deposition of an epitaxial layer of GaAs to commence. The time taken for a shutter 15 to move from a first fully open condition allowing the molecular beam to exit the associated effusion cell 14 to a second fully closed condition shutting off the molecular beam or vice versa will normally be about 0.1 to 0.2 seconds and so a predetermined period of the order of 0.1 seconds is required to switch off or on a group III molecular beam by closing or opening the shutter 15. In this predetermined period required, in this case, to close the outlet of the aluminium effusion cell 14, a pulsed operation laser (as indicated by the broad arrow L in the figure) irradiates the exposed surface of the epitaxial layer from the other side of the viewing port 22, thus applying heat pulses to heat the surface of the already formed epitaxial layer to cause smoothing of the layer on an atomic level. It is thought that this smoothing results from cation surface diffusion (caused by the increased temperature) which leads to increased widths of the growth terraces and so to a smoother layer surface.

Operation of the laser is controlled by the computer controlling operation of the shutters 15. Thus, the laser is activated to direct one or more laser pulses at the surface of the already formed gallium aluminium arsenide layer during the predetermined period in which the aluminium element effusion cell outlet is determined by the computer to be being closed. There may be a delay of the order of a tenth of a second or so between commencement of the closing of the shutter and application of the laser pulse(s) to the exposed surface and the laser pulse(s) should be applied so that there is a short period between the end of the or the last laser pulse and the time at which the shutter becomes fully closed to enable the surface temperature to return to the desired growth temperature, for example 650 degrees Celsius.

After the application of the laser pulse(s) to heat the exposed surface and after the surface temperature returns to the desired growth temperature, that is when the shutter 15 of the Al source is fully closed, the molecular beam of gallium molecules directed at the substrate commences growth of an epitaxial layer of gallium arsenide.

Changes in the diffraction pattern observed using the RHEED technique are related to surface diffusion of atoms and so the RHEED technique may be used to determine when the surface diffusion caused by the laser pulse(s) applied to the surface has ceased enabling a determination to be made by the computer as to when the surface temperature returns to the desired growth temperature. Other suitable methods may be used for determining the change of surface temperature.

When the desired thickness of gallium arsenide, for example a thickness of 10 nm as determined by the RHEED technique, has been grown, then in the predetermined period required to open the shutter of the aluminium source effusion cell 14 so that both gallium and aluminium molecular beams or fluxes each of, for example, 1 to 2 atoms/cm$^2$/sec are supplied to the substrate to commence growth of a layer of gallium aluminium arsenide on the already formed layer of gallium arsenide, one or more laser pulses are directed at the exposed surface of the GaAs layer (in this case) to cause smoothing of the layer surface. When the surface temperature of the gallium arsenide layer has returned to the desired growth temperature, and the shutter 15 of the aluminium effusion cell is fully open, growth of a layer of gallium aluminium arsenide commences, the relative fluxes of the gallium and aluminium sources determining the composition of the layer being grown. Again there may be a delay between commencing of the opening of the shutter of the aluminium source and application of the or the first laser pulse and similarly a delay between the end of the or the last laser pulse and the time at which the Al shutter becomes fully open.

When a layer of gallium aluminium arsenide has grown, as determined by appropriate techniques, e.g. the RHEED technique, to the appropriate thickness of monolayers, for example a thickness of 10 nm, the shutter of the aluminium source effusion cell 14 is moved to close off the outlet of the cell. Again, in the period of approximately 0.1 seconds within which the shutter is being closed, the laser L is activated to direct one or more laser pulses at the exposed surface to heat the exposed surface (this time of the gallium aluminium arsenide layer) to smooth the surface as described above.

Further alternate layers of gallium arsenide and gallium aluminium arsenide can then be grown in the same manner, with the exposed surface being heated as described above at each changeover so as to smooth the interface between adjacent layers and a final capping layer of $Ga_xAl_{1-x}As$ may be provided over the last smoothed layer surface.

Such a technique enables smoothing over a much shorter time scale than would be required if growth were merely interrupted to give time for smoothing and so enables the risk of contamination of the interface between layers caused by such interruptions to be minimised. Also, as the binding energies of undesired impurities are much lower than those of the gallium, aluminium and arsenic atoms which make up the crystal structure, the desorption rates for such undesired impurities could be much higher so facilitating the production of an even less contaminated smooth surface at the interface between layers.

In the above example where alternate layers of gallium arsenide and gallium aluminium arsenide are being grown the laser L may be, for example, a ruby laser producing laser light at a wavelength of 694 nm with a pulse duration of 25 nanoseconds and a peak output power per pulse of 60 megawatts, and may be activated to direct only a single laser pulse at the exposed surface layer. Other lasers may however be used, the number of pulses applied to the substrate being selected so as, given the peak output power per pulse of the laser selected, to produce the desired heating of the exposed surface. The peak output power of the laser used should of course not be sufficient to cause significant desorption of surface atoms. Similarly the wavelength of the laser light used will depend on the material being grown and should be selected so as to cause surface heating without sufficiently exciting vibrational modes of the surface atoms to cause significant desorption of atoms from the surface. In the above example where layers of gallium arsenide and gallium aluminium arsenide are being grown, the wavelength selected should be in the visible range of the electromagnetic spectrum. Although in the example given above laser radiation having a wavelength at the red end of the visible range of the spectrum is used, shorter wavelengths in the visible range may be used which should have the advantage of confining heating to an even smaller thickness of the epitaxial layer as the penetration depth of such shorter wavelengths will be less. Thus, for example a neodynium YAG laser and frequency doubler may be used to provide laser light at the blue end of the visible range of the electromagnetic spectrum.

To ensure uniform heating of the exposed surface, a beam expander may be used to expand the diameter of the laser pulse or the laser may be scanned rapidly across the surface. Alternatively, a number of laser sources may be provided, possibly by using a beam splitter.

In the method described above, there is no interruption of growth. However, this need not necessarily be the case and, as in the prior method described above, the growth process could be interrupted (by switching off the gallium source during the predetermined period in the example described above) for a time of the order of only a few seconds or tenths of seconds rather than of the order of a few minutes as in the prior method although this could increase the risk of surface contamination.

It should, of course, be appreciated that the method described above can be applied to the growth of other materials such as other III-V semiconductor materials for example consisting of alternate gallium phosphide and gallium aluminium phosphide layers, or other semiconductor materials for example of different II-VI compounds or alternate layers of silicon and a silicon-germanium alloy. Also, although as described above alternate layers are formed of different semiconductor materials, the alternate layers may be formed of the same semiconductor material but with different doping so that, for example, a structure of alternately n and p doped layers of gallium arsenide or of silicon could be grown. Similarly, a repeat pattern of three (or more) different layers could be grown.

Although the method described above uses an MBE technique, it should of course be appreciated that the method may also be applicable in a gas source MBE(GSMBE) method where, for example, group III compounds may be supplied to the reaction chamber as gaseous alkyls and group V compounds as hydrides. Similarly, the method may also be applicable in techniques such as low pressure or atmospheric chemical vapour deposition or metal organic chemical vapour deposition.

The thickness of layers grown using a method embodying the invention is not material to the invention and a method embodying the invention could be used in circumstances where the layers to be grown are relatively thick, say 100 nm or more but where a good atomically smooth interface is required. A method embodying the invention may however show particular advantages for superlattice and multiple quantum well structures where the interfaces between layers form a large percentage of the structure and so may have a large effect on its characteristics.

From reading the present disclosure, other modifications will be apparent to persons skilled in the art. Such modifications may involve other features which are already known in the design of semiconductor devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalisation or modification of one or more of those features, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device, which method comprises supplying gaseous material via supply means into a reaction chamber containing a substrate to cause a first epitaxial layer of a first material to grow on the substrate and operating switching means to alter within a predetermined period the supply of gaseous material via the supply means into the reaction chamber to cause a second epitaxial layer of a second material to grow on the first layer characterised by, during the predetermined period, activating a radiant heat source directed at a surface of the first layer so as to radiantly heat the surface of the first layer only during the predetermined period so as to smooth the first layer before growth of the second layer is commenced.

2. A method according to claim 1, which method comprises radiantly heating the surface of the first layer by directing a laser source at the first layer during the predetermined period.

3. A method according to claim 2, which method comprises causing the laser to pulse on and off during the predetermined period.

4. A method according to claim 1, 2 or 3, which comprises growing further alternate first and second layers including activating the radiant heat source to radiantly heat the surface of each layer during the predetermined period in which the supply of gaseous material is being altered to supply the gaseous material via the supply means so as to smooth a layer on an atomic level before growth of the next layer is commenced.

5. A method according to claim 1, 2, or 3 which method comprises maintaining a pressure below atmospheric pressure within the reaction chamber.

6. A method according to claim 5, which comprises maintaining an ultra high vacuum within the reaction chamber and introducing gaseous material into the reaction chamber by directing a beam of molecules, atoms or ions into the reaction chamber towards the substrate.

7. A method according to claim 1, 2 or 3 which comprises introducing at least part of the gaseous material as a gaseous metal organic compound.

8. A method according to claim 7, which comprises introducing the gaseous material into the reaction chamber to grow the layers so that at least one of the first and second layers has a thickness less than approximately 50 nm.

9. A method according to claims 1, 2, or 3, in which the steps of introducing the gaseous material to grow the first and second layers comprises introducing gaseous material comprising group III and group V elements so that the or each first layer grows as an epitaxial layer of a first III-V semiconductor material and the or each second layer grows as an epitaxial layer of a second III-V semiconductor material.

10. A method according to claim 9, in which the gaseous material introduced to grow the or each first layer comprises separate sources of gallium and arsenic and the gaseous material introduced to grow the or each second layer comprises separate sources of gallium, aluminium and arsenic.

11. A method according to claim 4, which method comprises maintaining a pressure below atmospheric pressure within the reaction chamber.

12. A method according to claim 11, which comprises maintaining an ultra high vacuum within the reaction chamber and introducing gaseous material into the reaction chamber by directing a beam of molecules, atoms or ions into the reaction chamber towards the substrate.

13. A method according to claim 12, which comprises introducing the gaseous material into the reaction chamber to grow the layers so that at least one of the first and second layers has a thickness less than approximately 50 nm.

14. A method according to claim 4, which comprises introducing at least part of the gaseous material as a gaseous metal organic compound.

15. A method according to claim 4, in which the steps of introducing the gaseous material to grow the first and second layers comprises introducing gaseous material comprising group III and group V elements so that the or each first layer grows as an epitaxial layer of a first III-V semiconductor material and the or each second layer grows as an epitaxial layer of a second III-V semiconductor material.

16. A method according to claim 15, in which the gaseous material introduced to grow the or each first layer comprises separate source of gallium and arsenic and the gaseous material introduced to grow the or each second layer comprises separate sources of gallium, aluminum and arsenic.

* * * * *